(12) United States Patent
Luk et al.

(10) Patent No.: US 7,466,617 B2
(45) Date of Patent: Dec. 16, 2008

(54) MULTI-PORT DYNAMIC MEMORY STRUCTURES

(75) Inventors: Wing K. Luk, Chappaqua, NY (US); Brian L. Ji, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/623,434

(22) Filed: Jan. 16, 2007

(65) Prior Publication Data

US 2008/0175086 A1 Jul. 24, 2008

(51) Int. Cl.
*G11C 11/34* (2006.01)
(52) U.S. Cl. .................................. 365/222; 365/205
(58) Field of Classification Search ................ 365/222, 365/205
See application file for complete search history.

(56) References Cited

U.S. PATENT DOCUMENTS

| | | | |
|---|---|---|---|
| 3,387,286 A | 6/1968 | Dennard | |
| 5,768,186 A | 6/1998 | Ma | |
| 6,211,548 B1 | 4/2001 | Ma | |
| 6,475,874 B2 | 11/2002 | Xiang et al. | |
| 6,573,134 B2 | 6/2003 | Ma et al. | |
| 6,614,064 B1 | 9/2003 | Besser et al. | |
| 6,664,589 B2 | 12/2003 | Forbes et al. | |
| 6,750,066 B1 | 6/2004 | Cheung et al. | |
| 6,916,698 B2 | 7/2005 | Mocuta et al. | |
| 6,924,184 B2 | 8/2005 | Cave et al. | |
| 7,027,326 B2 | 4/2006 | Luk et al. | |
| 2001/0035548 A1* | 11/2001 | Wahlstrom | 257/296 |
| 2005/0128803 A1 | 6/2005 | Luk et al. | |
| 2005/0145895 A1 | 7/2005 | Luk et al. | |

OTHER PUBLICATIONS

Doris et al., "High Performance FDSOI CMOS Technology with Metal Gate and High-k," 4-900784-00-1, Symp on VLSI Techn Digest of Technical Papers, pp. 214-215 (2005).
Hou et al., "Impact of Metal Gate Work Function on Nano CMOS Device Performance," 0-7803-8511-X, IEEE, pp. 57-60 (2004).
Luk et al., "Dynamic Memory Cell Structures," U.S. Appl. No. 11/408,752 (Apr. 21, 2006).
Park et al., "Novel Damage-free Direct Metal Gate Process Using Atomic Layer Deposition," Symp on VLSI Techn Digest of Tech. Papers, pp. 65-66 (2001).
Karp et al., "A 4096-bit dynamic MOS RAM," ISSCC Digest Technical Papers, pp. 10-11 (Feb. 1972).
Zhu et al., "Schottky s/d MOSFETs with high-K gate dielectrics and metal gate electrodes," 0-7803-8511-X, IEEE, pp. 53-56 (2004).

* cited by examiner

*Primary Examiner*—Michael T Tran
(74) *Attorney, Agent, or Firm*—Ryan, Mason & Lewis, LLP

(57) ABSTRACT

A dynamic random access memory circuit has at least one write bit line, at least one read bit line, a capacitive storage device, a write access device operatively coupled to the capacitive storage device and the at least one write bit line, a sense amplifier operatively coupled to the at least one read bit line and configured to generate an output signal, and a refresh bypass device operatively associated with the sense amplifier and the at least one write bit line so as to selectively pass the output signal to the at least one write bit line.

10 Claims, 16 Drawing Sheets

MULTI-PORT DYNAMIC MEMORY STRUCTURES

FIELD OF THE INVENTION

The present invention relates to electronic circuits and, more particularly, relates to dynamic memory.

BACKGROUND OF THE INVENTION

In dynamic random access memory (DRAM) cells, such as the 1T1C cell, the 3T (or 3T1C) gain cell, and the gated diode cells, 0- and 1-data are stored as electric charges in various storage elements, such as a stack capacitor, trench capacitor, transistor gate capacitor, and gated diode. The stored charges can only remain in the storage element for a finite amount of time, as there are leakage paths from the storage node, which holds the charges, to the neighboring nodes. Typical leakage paths are the source-drain path of the write device under sub-threshold leakage, the tunneling leakage through the storage element oxide and the gate oxide of the write device and the read device (as in the case for the 3T, 3T1C, 3T1D and 2T1D cells, for example), and the storage node to silicon body leakage via the junction leakage of the write device.

Traditionally, in order to hold the data for a longer or an indefinite amount of time, the stored charges are periodically "refreshed" in accordance with the "retention time" of the memory. Refreshing of the memory cells is typically carried out by allocating some predetermined time (memory cycles) to reading data from each cell and writing the same data back to the cell. During refreshing of the memory cells, the memory array that contains the cells being refreshed is suspended from the normal read and write operations, thereby reducing the availability of the memory array for normal read and write operations and, hence, potentially reducing the overall system performance. The more often the memory array needs to be refreshed (i.e., the shorter the retention time), the lower the availability of the memory array for normal operations and potentially the lower the overall system performance.

For commodity-type 1T1C DRAM, the refresh interval (which is required to be less than the smallest retention time) for a wordline address is typically 128 ms, with a 20 ns DRAM cycle time. Therefore, in a memory system that has 8 arrays and 512 rows per array (for a total of 4096 words), the refreshing time for the system is 20*4096 ns=80 μs. The percentage of time required for refreshing the memory is 0.06% (80 μs/128000 μs), which is a relatively small penalty for most applications.

The device variability of semiconductor technology has become a major issue as the minimum feature size approaches the physical limits. This leads to the instability of, for example, 6T SRAM cells, which limits the scaling of the cells. Dynamic memory is being considered as a potential alternative for high speed embedded cache in order to attain better density and to address the stability issues facing the 6T SRAM cells (which have been traditionally used in the area). For high speed dynamic cache memory, the refresh interval is smaller (for example, about 10-348 μs) due to the smaller cell retention time associated with the logic-based embedded DRAM technology (with a 2 ns refresh cycle time, for example) Therefore, for example, in a memory system that has 8 arrays and 128 rows per array (for a total of 1024 rows), the refreshing time is 2048 ns (2 ns*1024 rows). Assuming an exemplary refresh interval of 20 μs, the percentage of time required for refreshing the high speed memory is 10% (2048 rows/35200 ns). Assuming a typical L2 cache miss ratio of 5% using conventional 6T SRAM, the exemplary 10% cache utilization for refreshing the dynamic cells will significantly impact the cache performance.

For a given high speed dynamic memory cell with a certain retention time, it would be beneficial to improve the refreshing scheme by hiding the refresh cycles for read operations, write operations, or both, in order to make either the read operation, the write operation, or both operations more highly available. That is, if a refresh cycle were "hidden," it would not prevent the carrying out of a read or write operation, as the case may be, during the "hidden" refresh.

SUMMARY OF THE INVENTION

In one exemplary embodiment, a dynamic random access memory circuit includes at least one write bit line, at least one read bit line, a capacitive storage device, a write access device operatively coupled to the capacitive storage device and the at least one write bit line, a sense amplifier operatively coupled to the at least one read bit line and configured to generate an output signal, and a refresh bypass device operatively associated with the sense amplifier and the at least one write bit line (for example, implemented separately therefrom and operatively coupled thereto, or implemented inside the sense amplifier) so as to selectively pass the output signal to the at least one write bit line.

In another exemplary embodiment, a dynamic random access memory circuit includes at least one write bit line, at least one read bit line, a capacitive storage device, a write access device operatively coupled to the capacitive storage device and the at least one write bit line, a first sense amplifier operatively coupled to the at least one read bit line and configured to generate an output signal, a refresh sense amplifier operatively coupled to the at least one write bit line and configured to generate a refresh sense amplifier output signal, and a refresh bypass device operatively associated with the refresh sense amplifier and the at least one write bit line (for example, implemented separately therefrom and operatively coupled thereto, or implemented inside the refresh sense amplifier) so as to selectively pass the refresh sense amplifier output signal to the at least one write bit line.

In yet another exemplary embodiment, a dynamic random access memory circuit includes at least one write bit line, at least one read bit line, a capacitive storage device, a write access device operatively coupled to the capacitive storage device and the at least one write bit line, and a refresh select bypass device operatively coupled to the capacitive storage device and configured to selectively pass an indication of data stored in the capacitive storage device to the at least one write bit line while maintaining the data stored in the capacitive storage device.

In another aspect, an exemplary method for refreshing data in a dynamic random access memory circuit includes the steps of reading the data from a capacitive storage device of a memory cell of the circuit into a sense amplifier, via a read port of the cell, passing the read data to a write port of the cell (for example, via a refresh bypass device), and writing the data from the write port to the capacitive storage device.

In still another aspect, an exemplary method for performing a read operation when writing data to a dynamic random access memory circuit includes the steps of writing the data to a capacitive storage device of a memory cell of the circuit from a data input signal, and passing the data from the data input signal to a data output signal when a read address and write address identify the cell.

In yet another aspect, an exemplary method for refreshing data to a dynamic random access memory circuit includes the steps of reading the data from a capacitive storage device of a memory cell of the circuit into a refresh sense amplifier, wherein the data is read from the capacitive storage device via an exclusive write port of the cell, and writing the data from the sense amplifier to the capacitive storage device (for example, via a refresh bypass device).

A more complete understanding of the present invention, as well as further features and advantages of the present invention, will be obtained by reference to the following detailed description and drawings.

BRIEF DESCRIPTION OF THE DRAWINGS

FIG. 10 shows an exemplary embodiment of an array structure of the 3T1D-gated-diode-cell memory circuit with refresh using the write-port;

FIG. 11 shows an exemplary embodiment of an array structure of the 2T1D-gated-diode-cell-memory circuit with refresh using the write-port;

DETAILED DESCRIPTION

Figure 1:
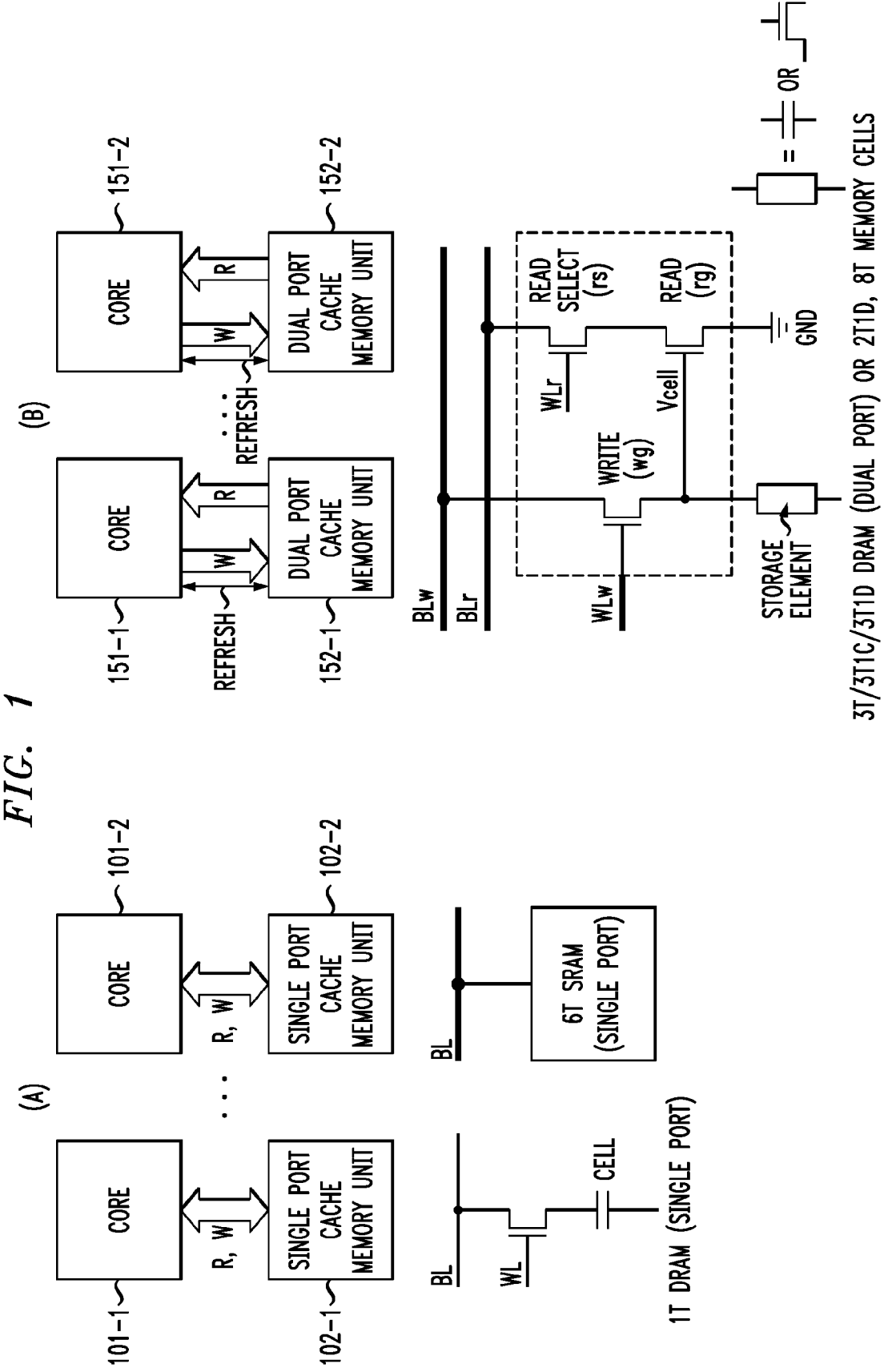
FIG. 1A shows block diagrams and circuit diagrams of processor core(s) with single port cache memory unit(s) comprising a single port 1T DRAM cell or 6T SRAM cell.
FIG. 1B shows block diagrams and circuit diagrams of processor core(s) with dual- or multi-port cache memory units comprising a 2T1D, 3T, 3T1C or 3T1D dynamic memory cell or 8T static memory cell.

FIG. 1A shows block diagrams and circuit diagrams of processor core(s) 101-1, 101-2 with single port cache memory unit(s) 102-1, 102-2 employing, respectively, a one transistor (1T) DRAM cell and a six transistor (6T) SRAM cell. Both read and write data pass through the single port, potentially creating read and write conflicts, such as a high volume of write operations that may stall the read operation (s), resulting in an increase of the miss rate. Furthermore, cache memory based on dynamic memory requires refresh operations which reduce the cache read/write availability as the single port is required for refresh operations and is not always available for normal read/write operations. FIG. 1B shows block diagrams and circuit diagrams of processor core (s) 151-1, 151-2 with dual- or multi-port cache memory units 152-1, 152-2 employing, respectively, a two transistor one diode (2T1D), three transistor (3T), three transistor one capacitor (3T1C) and three transistor one diode (3T1D) dynamic memory cell or eight transistor (8T) static memory cell. Read and write data pass through the independent read and write ports, respectively. In this case, a high volume of write operations may not lead to read stall.

Aspects of one or more exemplary embodiments of the invention include refreshing memory cells while reducing interruptions or suspensions of the normal read operations for multi-port dynamic memory. The refresh cycle can be "hidden" from the read operation, so that the read operations can be made available more of the time via the read-port of the memory array. As shown in FIG. 1B, the refreshing of the stored data may be performed via the write-port of the memory array, leaving the read-port available substantially all the time for read operations. Write, refresh, and reload operations of the dynamic memory can be performed via the write port alone.

Figure 2:
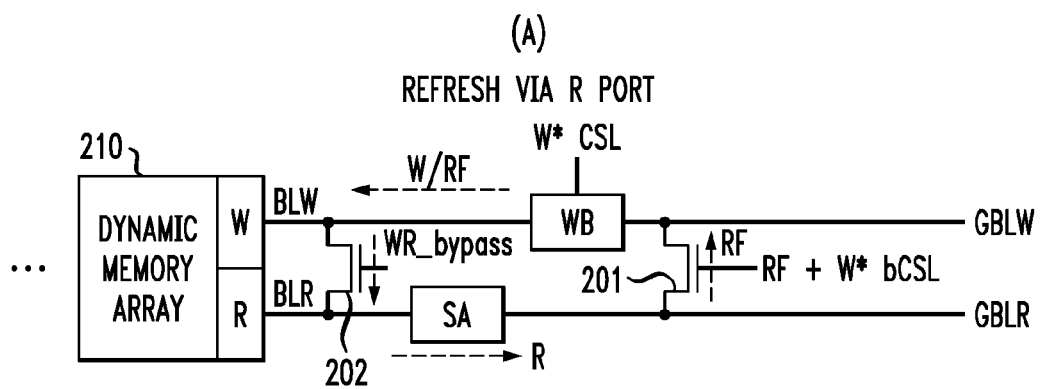
FIG. 2A shows the data paths for refresh operations via read and write ports.
FIG. 2B shows the data paths for refresh operations via a write port.
FIG. 2C shows the data paths for read, write and refresh operations for multi-port memory with more than one read port.
Figure 2:
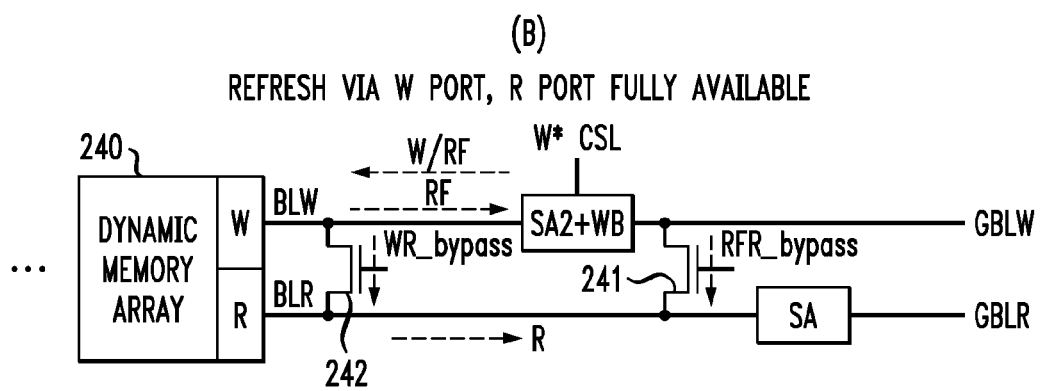
Figure 2:
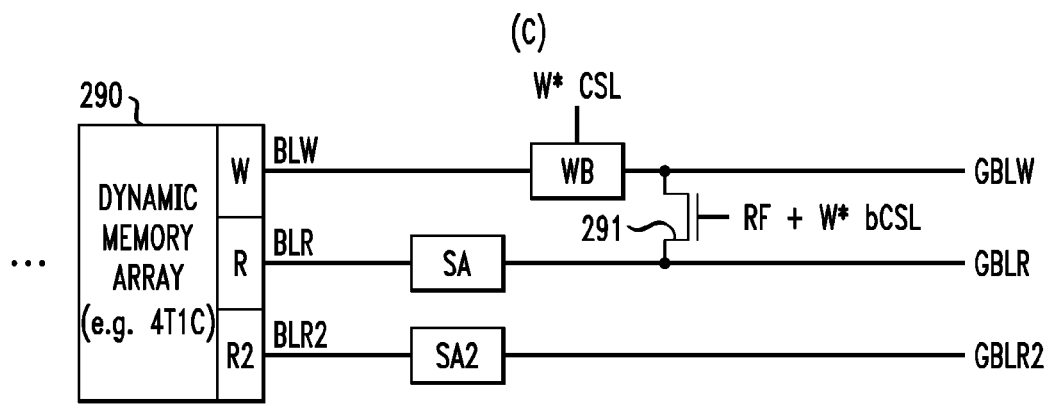

Note that as used herein, including the claims, "operatively coupled" is defined as meaning the given elements are electrically interconnected either directly or indirectly through other elements, devices or components so as to provide functionality for a given operation, for example, reading or writing data FIG. 2A shows the data paths for refresh operations via read R and write W ports, further detailed in the embodiments of FIGS. 3-9. In FIG. 2A, a read operation (R) is performed via the read port R and data is detected by and stored in the sense amplifier (SA). As is well-known to the skilled artisan, a sense amplifier reads and restores the signal from a cell. Refresh operation (RF) is carried out after a read operation and through the refresh path (RF) (via a transistor 201, for example) when the write signal is not active, and data is coupled back to the memory cell 210 via the write port W A write operation (W) is performed via the write port W, and data is written to the memory cell 210 from a write buffer (WB). There is a write-read bypass (WR_bypass) data path between the write path and the read path. For example, such a data path can be implemented via a write-read bypass device such as a write-read bypass transistor. In the example shown, the write data is coupled to the read path (via a transistor 202, for example) under a certain condition of operation when the write and read operations address the same cell, further detailed in FIGS. 3-9.

FIG. 2B shows the data paths for refresh operations (RF) via a write port W. The read port R is used exclusively for the read operation (R). During refresh, data is detected by the sense amplifier (SA2) and written back to the cell 240. There is a write-read bypass (WR_bypass) data path between the write path and the read path. For example, such a data path can be implemented via a write-read bypass device such as a write-read bypass transistor. In the example shown, the write data is coupled to the read path (via a transistor 242, for example) under a certain condition of operation when the write and read operations address the same cell, further detailed in FIGS. 3-9. There is a refresh-read bypass (RFR_bypass) data path between the write/refresh path and the read path. For example, such a data path can be implemented via a refresh-read bypass device such as a refresh-read bypass transistor. In the example shown, refresh data is coupled to the read path (via a transistor 241, for example) under a certain condition of operation, further detailed in FIGS. 3-9

FIG. 2C shows the data paths for read, write and refresh operations for multi-port memory 290 with more than one read port R, R2. The read port R is used for read operations and the write port W is used for write operations Refresh is carried out via the read port R and the write port W (similar to that described in FIG. 2B).

I. Basic Operations of the Dual-Port Dynamic Memory Cells

Figure 3A:
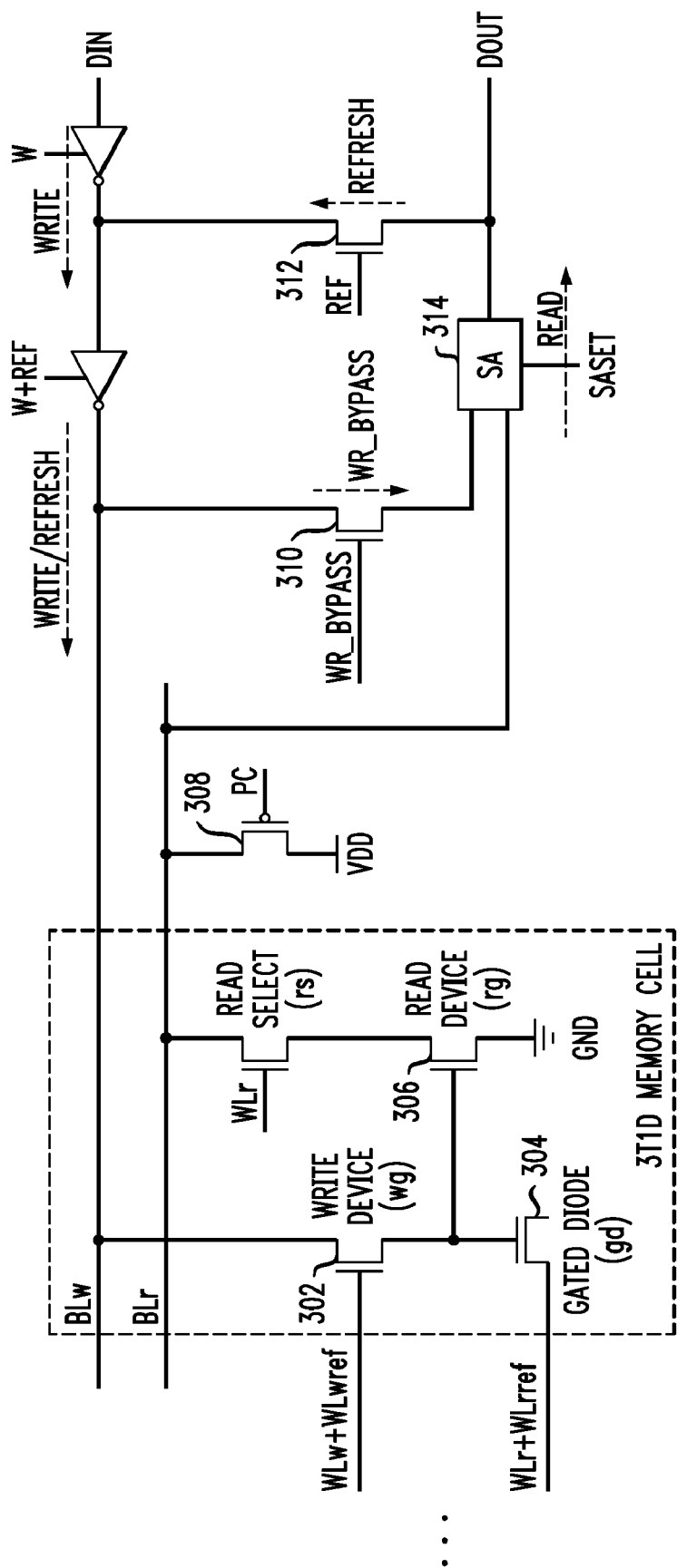
FIGS. 3A, 3B, and 3C show exemplary embodiments of 3T1D-cell and 2T1D-cell gated diode dynamic memory circuits according to an aspect of the present invention, including non-destructive refresh via R and W ports.
Figure 3B:
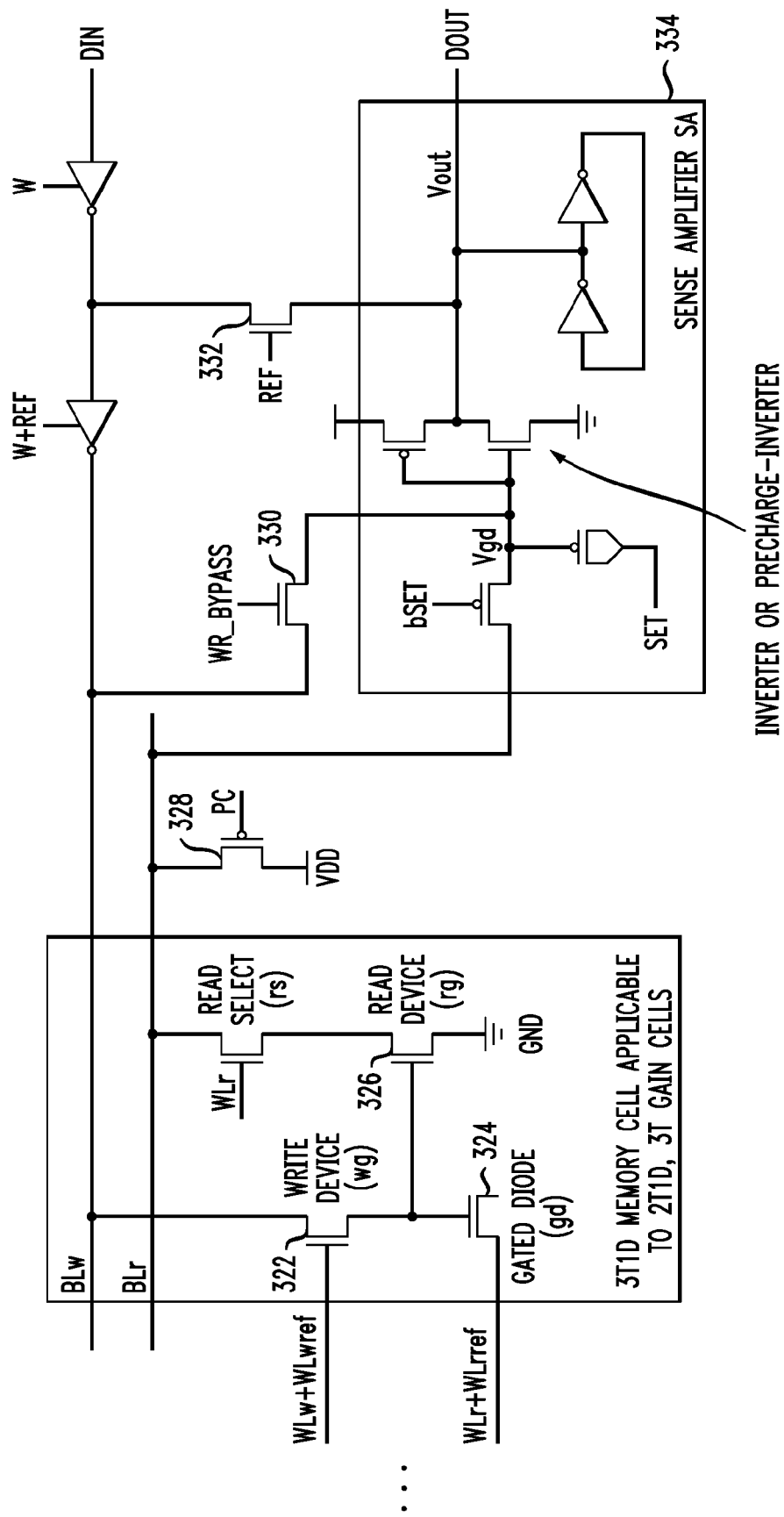
Figure 3C:
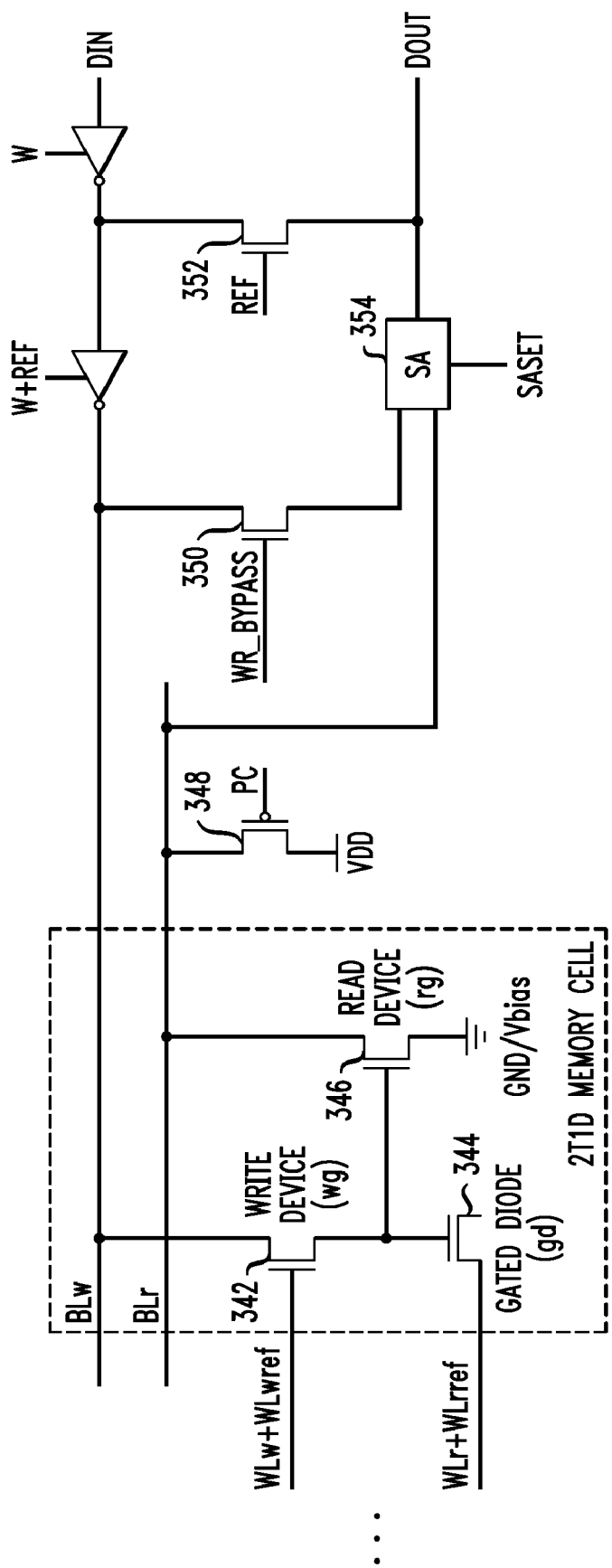
Figure 4:
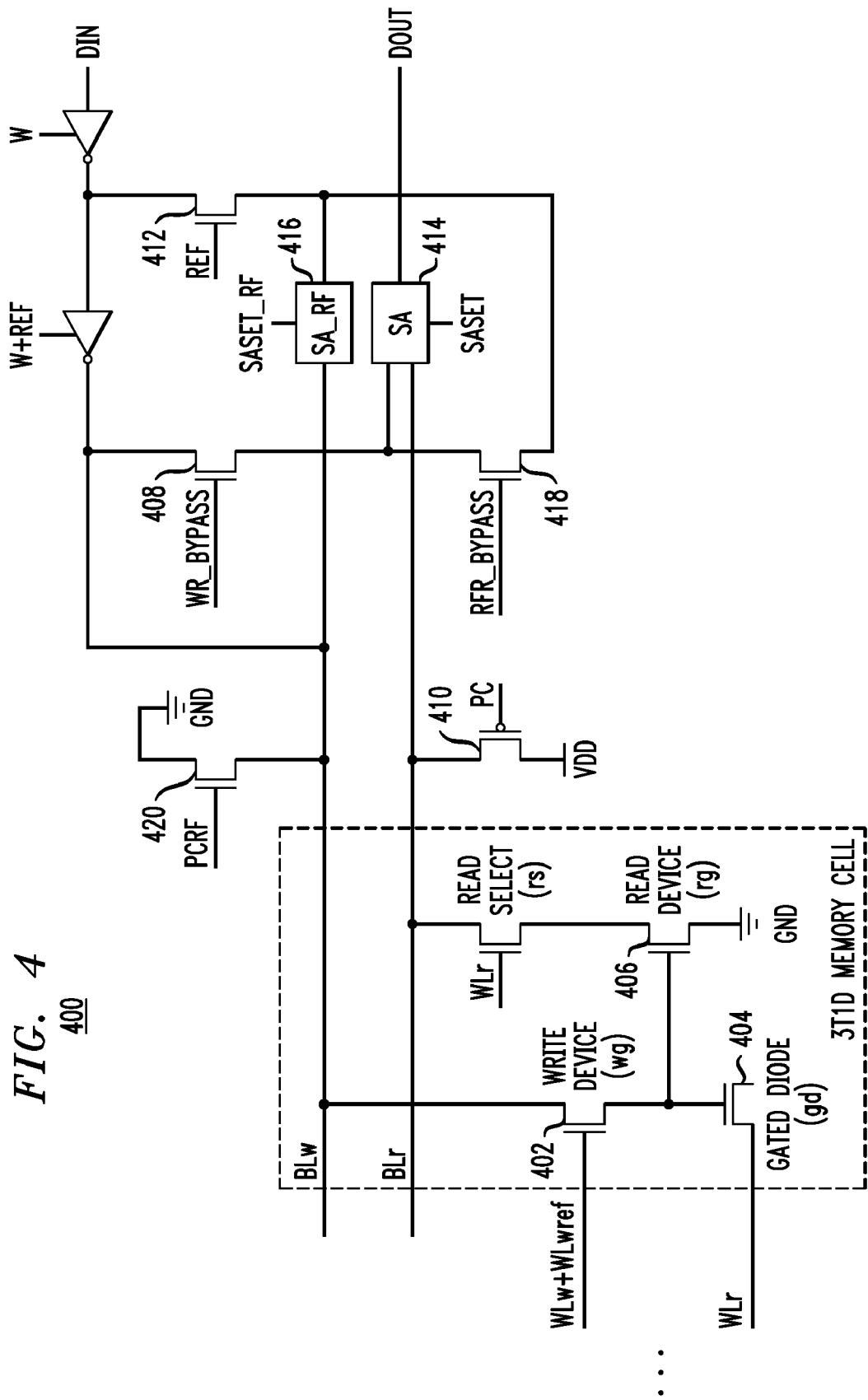
FIGS. 4 and 5 show block diagrams of exemplary embodiments of 3T1D-cell and 2T1D-cell gated diode dynamic memory circuits according to an aspect of the present invention, including hidden refresh for read via a write port.
Figure 5:
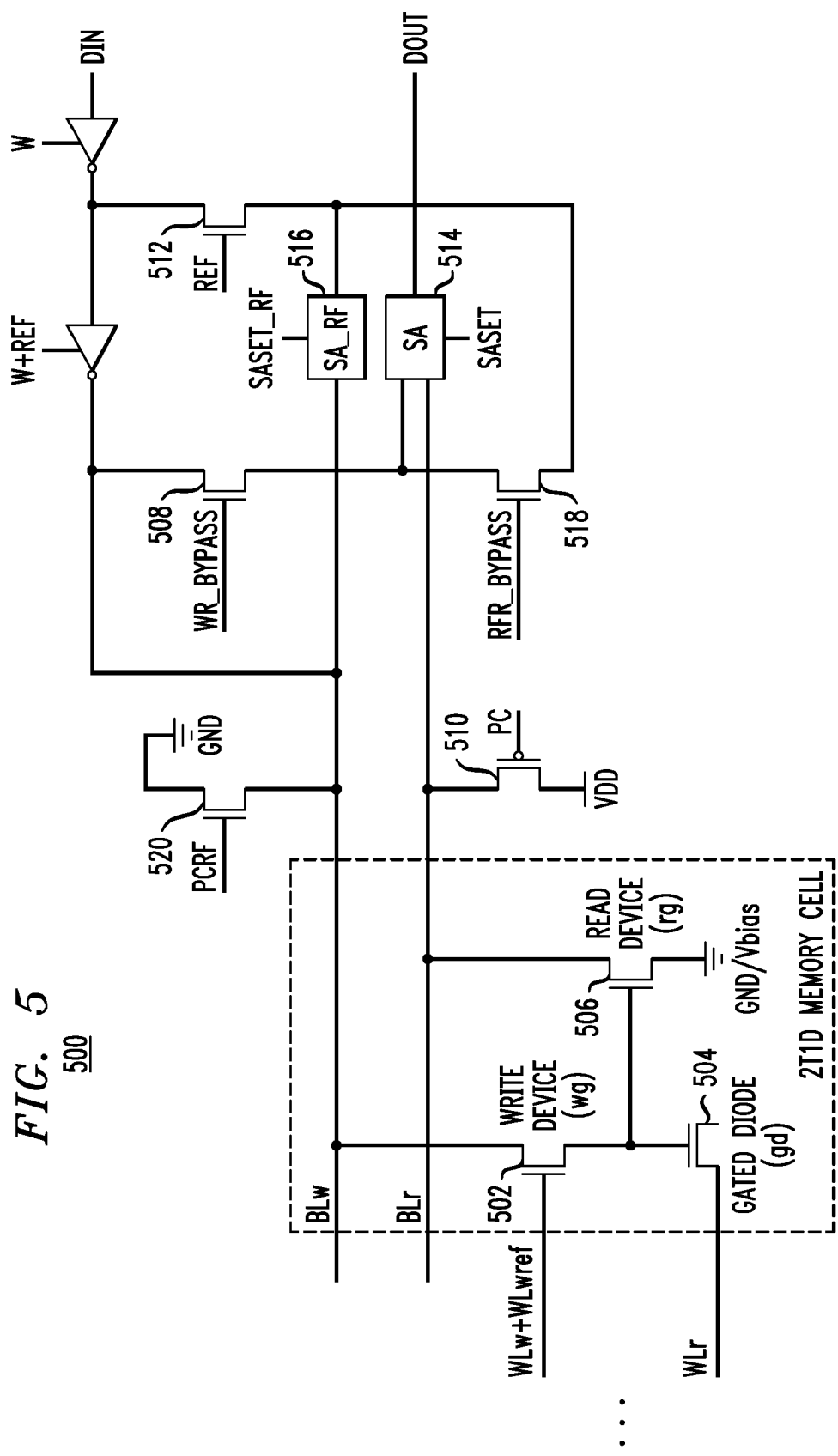
Figure 6:
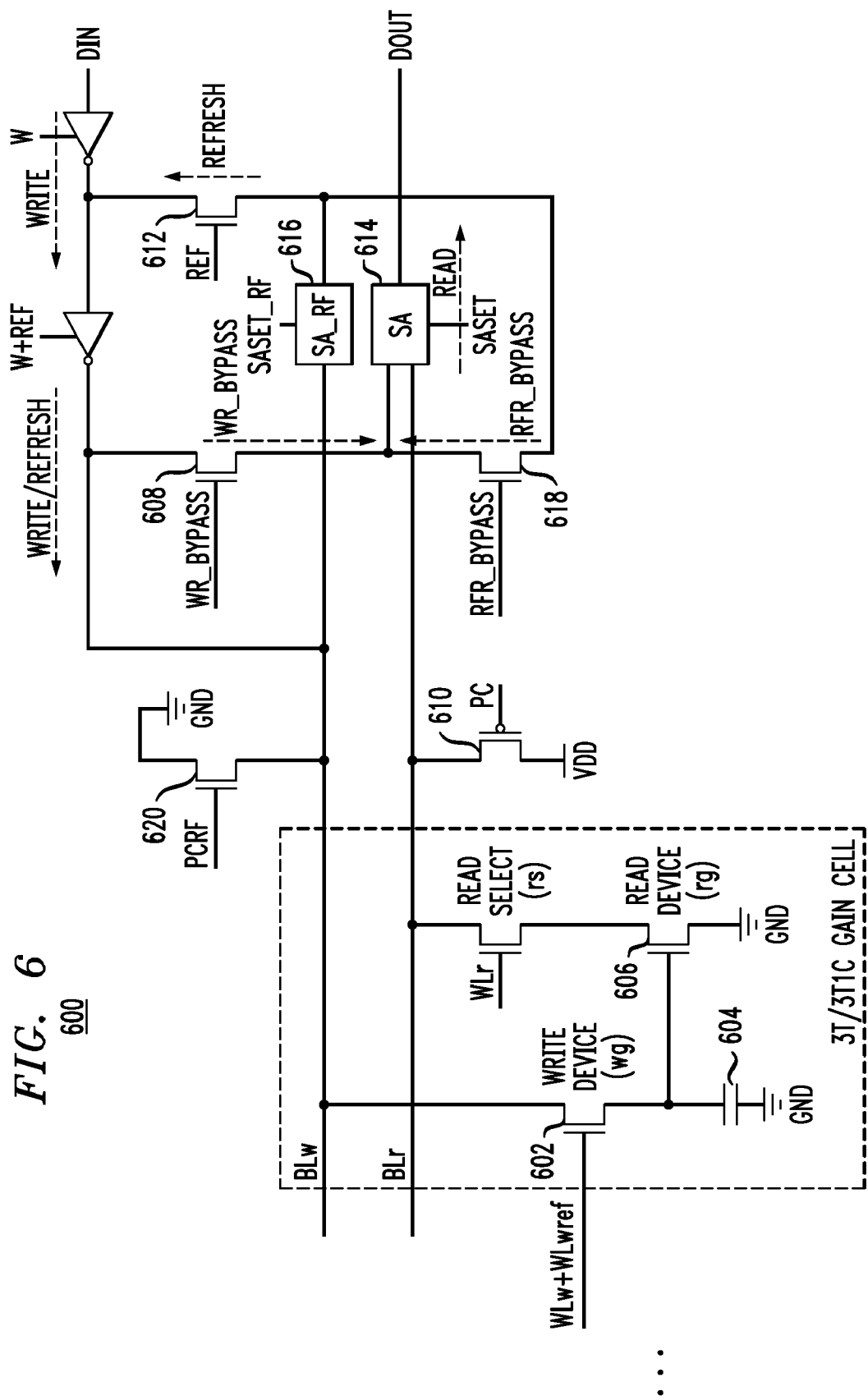
FIG. 6 shows an exemplary embodiment of a 3T (or 3T1C) gain cell dynamic memory circuit according to an aspect of the present invention, namely hidden refresh for read via a write port.

FIGS. 3A, 3B, and 4 show block diagrams of exemplary inventive memory circuits employing 3T1D gated diode dynamic memory cells 300, 320, 400. FIGS. 3C and 5 show block diagrams of exemplary inventive memory circuits employing 2T1D gated diode dynamic memory cells 340, 500. FIG. 6 shows an exemplary inventive memory circuit employing 3T (or 3T1C) dynamic gain (memory) cell 600. Each exemplary dynamic memory cell 300, 320, 340, 400, 500, 600 (collectively referred to as cells DMC) includes one read-port and one write-port. The skilled artisan will be familiar with memory cells such as 1T1C, 3T, 1T1D, 2T1D, and 3T1D memory cells, per se; see, for example, U.S. Pat. No. 3,387,286, entitled "Field-effect Transistor DRAM," issued Jun. 4, 1968; Karp et al, "A 4096-bit Dynamic MOS RAM," ISSCC Digest Technical Papers, pp. 10-11, February 1972; U.S. Patent Application Publication Number 20050128803, Luk et al, entitled "Gated Diode Memory Cells," filed Dec. 11, 2003 and published Jun. 16, 2005; and U.S. Pat. No. 7,027,326, entitled "3T1D Memory Cells Using Gated Diodes and Methods of Use Thereof," issued Apr. 11, 2006. While only a single cell is shown in each figure for purposes of illustrative convenience, the ellipsis indicates that many other such cells can be provided. As is known to the skilled artisan, memory circuits can have many cells in a column of cells associated with a given read and write bit line BLw and BLr, and can have many sets of bit lines and thus many columns, as well as many rows, each row being associated with appropriate read and write word lines such as WLr and WLw. While only a single cell and one column's worth of refresh and bypass circuitry is shown in each figure it will be appreciated that inventive circuits can include many cells and appropriate refresh and bypass circuitry for each column. Indeed, the number of cells associated with a read and write bit line pair can range from, say, 8 or 16 for high speed applications using a hierarchical bit line structure, to 256 or 512 per bit line pair for dense memory arrays. These numbers are exemplary and not to be taken as limiting.

In the dual port implementation of these exemplary dynamic memory cells DMC, there are two bit lines, namely, BLw and BLr, operatively coupled to the cell DMC for write and read operations, respectively. The bit line BLw is operatively coupled to the write-port of the cell DMC for write operations, and the bit line BLr is operatively coupled to the read-port of the cell DMC for read operations. There are also two wordlines operatively coupled to the cell DMC for write, read, and refresh operations. The first wordline is activated by either signal WLw or signal WLwref, represented by WLw+WLwref, and the second wordline is activated by either signal WLr or signal WLrref, represented by WLr+WLrref To write to the cell DMC, the wordline signal WLw, which is normally LOW, is raised to HIGH and data from the bit line BLw, originating from the data input (Din) during a write operation, is written into the capacitive storage element (gated diode 304, 324, 344, 404, 504 and capacitor 604; collectively referred to as storage element SE) of the cell DMC. Before a read operation, the bit line BLr is precharged to HIGH via a PFET 308, 328, 348, 410, 510, 610 whose gate is connected to the precharge signal PC To read the memory cell DMC, the wordline signal WLr, which is normally LOW, is raised to HIGH. The bit line BLr stays HIGH if the cell DMC stored a 0-data and drops to LOW if the cell DMC stored a 1-data. The voltage on BLr during a read operation is detected by a sense amplifier 314, 334, 354, 414, 514, 614 (collectively referred to as sense amplifier SA) which outputs to the data output (Dout) a 0-data if the voltage on the BLr bit line stays HIGH and a 1-data if the voltage on the BLr bit line if the voltage drops to LOW. Complementary versions of the signals and complementary implementations of the memory cells and circuits would be apparent to the skilled artisan, given the teachings herein, and are not described in detail here, but are encompassed within the inventive scope.

In one exemplary embodiment, the write and read operations are synchronized with reference to a clock (not shown). Without loss of generality, it is assumed that the write and read operations each take a clock cycle to complete. In another exemplary embodiment, a refresh operation is a read operation followed by a write operation and requires two clock cycles to complete. In one or more embodiments, the write and read control signals, such as the precharge signal, the wordline signals, the sense amplifier signal, the refresh signal, and the bypass signals are derived from the clock, and the exact timing of these signals are adjusted relative to the clock edges for proper function and performance. The operation and timing requirements of these signals will be apparent to the skilled artisan, given the teachings herein.

II. Dynamic Memory Refresh Operation via Read and Write-Port

II.A. Refresh Bypass Device

As the charge stored in the storage element SE leaks gradually through the source to drain of the write access device 302, 322, 342, 402, 502, 602 (collectively referred to as write device WR) when the cell is not selected (the gate to source voltage of the write device is below the sub-threshold voltage), and through the gate of gated diode 304, 324, 344, 404, 504 and the gate of the read device 306, 326, 346, 406, 506, 606 (collectively referred to as read device RD), a refreshing of the charge in the storage element SE is needed after a certain amount of time, due to such leakage. In one aspect of the present invention, refresh operations can be carried out by reading the cell DMC as in a typical read operation, followed by writing the data back to the cell DMC via a novel refresh bypass device (REFRESH or REF, note that the symbol REF is used to represent both the refresh bypass device and its gate refresh signal for simplicity), for example FET (field effect transistor) 312, 332, 352, 412, 512, 612, 712, 812, 912 whose gate is controlled by the refresh signal REF, which is set to HIGH (REF=1) during a refresh operation. In one exemplary embodiment, this refresh scheme requires two cycles. In another exemplary embodiment, write and read operations cannot be performed during these two cycles as the bit lines BLr and Blw, and the sense amplifier SA are being used for the refresh operation.

II.B. Write-Read Bypass Device

For conventional multi-port memory cells, when the read address and the write address are the same, write and read operations to the same cell on the same wordline address occur. This is generally an undefined situation, as the write and read data are not necessarily the same. Thus, in prior art approaches, some priority or precedence between the write and read operations is assigned. In one exemplary embodiment of the invention, in situations where the write and read operations occur in the same write and read cycle to the same word line address, the read data is defined to be the same as the write data In one aspect of the present invention, this special case is handled as follows: the data is written into the cell DMC via a write operation through the activation of the wordline WLw, but the wordline WLr is not activated and the normal read operation is not performed; the write data is routed through a novel write-read bypass device, for example (WR_BYPASS) FET 310, 330, 350, 408, 508, 608, 708, 808, 908 to the sense amplifier SA and then outputted to the data output (Dout). In general, the write data is routed through the write-read bypass device from a signal point along the write line to a signal point along the read line and then outputted to the data output. For example, the write data from the write line can be routed via the write-read bypass device to a signal point along the read line, such as the sense amplifier (SA) input, or its tristate output, depending on the specific sense amplifier implementation. The gate of the write bypass path FET 310, 330, 350, 408, 508, 608, 708, 808, 908 is controlled by the bypass signal (WR_BYPASS), which is set to HIGH. It is required that a detection logic circuit (not shown for purposes of illustrative convenience, but the skilled artisan, with the teachings of the present disclosure in hand, will know how to implement a detection logic circuit) in the memory array detect this special condition (i.e., the write address being the same as the read address), and generate the bypass signal WR_BYPASS to activate the write bypass path FET 310, 330, 350, 408, 508, 608, 708, 808, 908 during the operation.

III. Refresh Operation with Hidden Refresh for Read Operations via Write Port

III.A. Refresh Sense Amplifier

In one aspect of the invention (refer to FIGS. 4-6), the refresh operation is performed exclusively through the write-port of the cells 400, 500, 600, 700 leaving the read-port available for read operations. As the charge stored in the storage element SE leaks gradually through the source to drain of the write device WR when the cell is not selected (the gate to source voltage of the write device is below the sub-threshold voltage), through the gate of gated diode 404, 504, 604, 704 and through the gate of the read device RD, refreshing of the charge in the storage element SE is needed after a certain period of time.

The refresh operation is performed by reading the stored cell data via the write port using the refresh sense amplifier 416, 516, 616, 716 (collectively referred to as refresh sense amplifier RSA) and then writing the data back to the cell DMC (assuming the memory storage element SE stored a LOW voltage for 0-data and a HIGH voltage for 1-data) via the write port. First, the write bit line (BLw) is precharged to a LOW voltage via the Refresh PC NFET 420, 520, 620, 720 (whose gate is connected to the control signal PCRF). To read the cell 400, 500, 600, 700 during a refresh operation, the wordline WLw is raised to turn ON the write device WR that connects the storage element SE to the write bit line (BLw). If a 0-data has been stored, the write bit line (BLw) stays LOW, as there is almost no charge transfer between storage element and the write bit line. If a 1-data has been stored, the voltage on the write bit line (BLw) rises as the charge stored in the storage element SE is transferred to the write bit line. The two different levels of voltage on the write bit line are detected by the refresh sense amplifier (RSA), as 0- and 1-data. Note that the RSA is denoted by SA2 (in FIG. 2B), SA_RF (in FIGS. 4-6), and SA_RF2 (in FIGS. 8, 9) The data is then written back to the cell 400, 500, 600, 700 through the refresh path (REFRESH), as illustrated in FIG. 6, and the refresh bypass FET 412, 512, 612, 712 whose gate is controlled by the refresh signal REF, which is set to HIGH (RF=1) during a refresh operation.

In one exemplary embodiment, the refresh scheme described above takes two cycles, during which write operations cannot be performed as the bit lines BLw are being used for the refresh operation.

At this point, it should be noted that in one or more embodiments of the invention a (refresh) sense amplifier can be designed without an external refresh bypass device (or by including the refresh bypass device as part of the (refresh) sense amplifier, or by other techniques) and that the data in the (refresh) sense amplifier is written back to the capacitive storage device via the write port. The refresh bypass device and inverters/buffers in the write-line are exemplary, typical circuit elements, and inventive techniques of refresh operation via write port (hidden refresh for read) can be carried out in other ways, which will be apparent to the skilled artisan, given the teachings herein It will be appreciated that in one aspect, an exemplary method for refreshing data to a dynamic random access memory cell includes the steps of reading the data from a capacitive storage device into a refresh sense amplifier, wherein the data is read from the capacitive storage device via an exclusive write port of the capacitive storage device, and writing the data from the sense amplifier to the capacitive storage device. The qualifier "exclusive" for the write port is employed, because some single port DRAMs, such as the 1T1C, have only a single port for both read and write. In this aspect of the, invention, the cell has at least one write port and one read port, and the write port is used for refreshing the data exclusively.

III.B. Refresh-Read Bypass Device

If the read address is the same as the refresh address and the refresh operation has been activated (during the subsequent cycle/stage of refresh), as described in Case 2.2 of the scheduling algorithm (described next) and in FIG. 13B, refresh-read bypass (RFR_BYPASS) device 418, 518, 618, 718 is utilized to pass the data in the refresh sense amplifier 416, 516, 616, 716 (obtained during the first clock cycle of the refresh operation) directly to sense amplifier 414, 514, 614, 714. This enables the read operation to be executed during the refresh operation.

Figure 7:
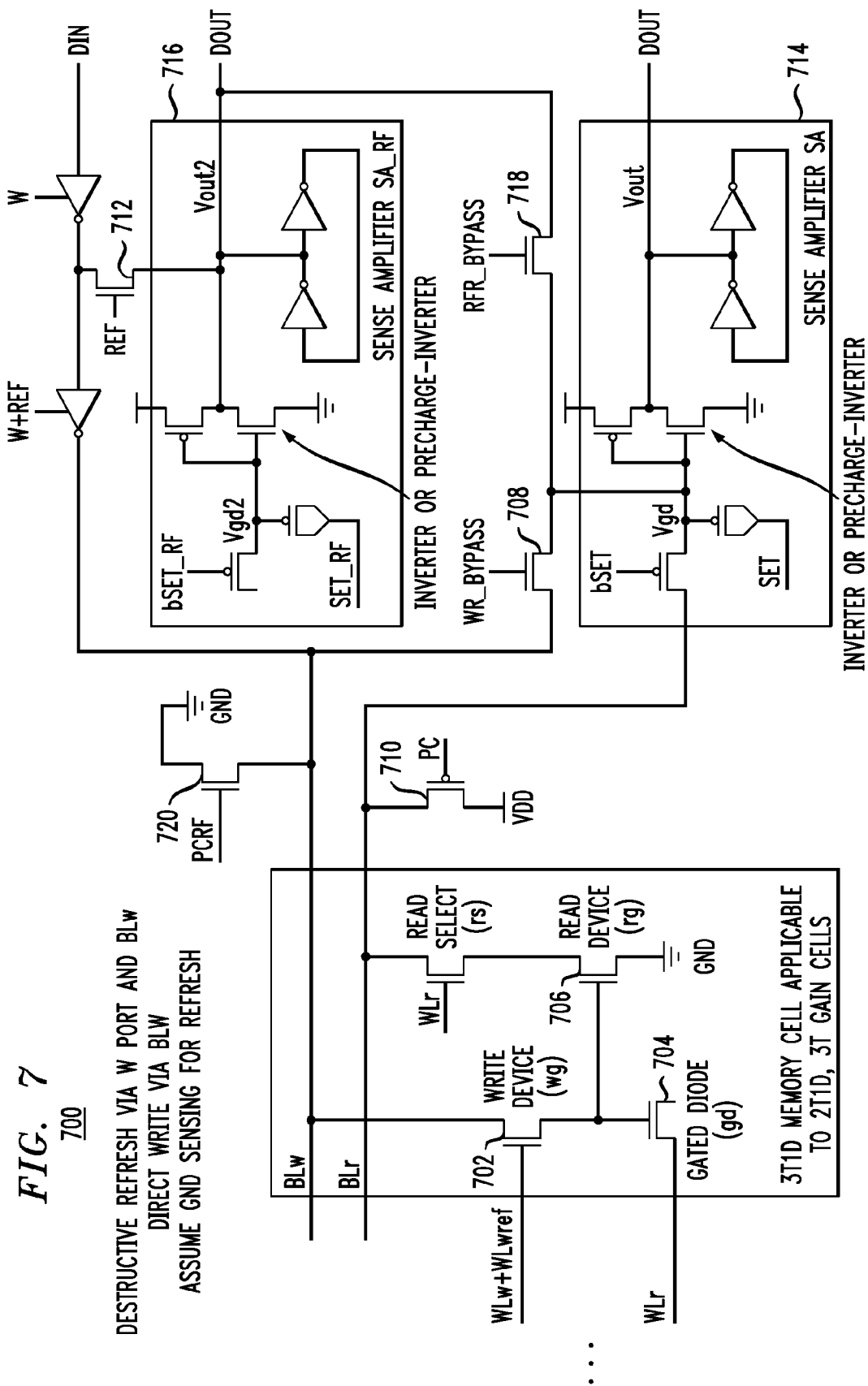
FIG. 7 shows a block diagram of a detailed FET circuit embodiment of the exemplary 3T 1D-cell memory circuit of FIG. 4.

In general, the refresh data can be routed through the refresh-read bypass device from a signal point associated with the refresh sense amplifier to a signal point along the read line, or the first sense amplifier, and then outputted to the data output (Dout). For example, the refresh data from the refresh sense amplifier can be routed via the refresh-read bypass device to the first sense amplifier input or it can be routed to its tristate output (both of which are signal points along the read line) depending on the specific sense amplifier implementation FIG. 7 shows a detailed FET circuit embodiment of the exemplary 3T1D cell memory circuit 400 of FIG. 4. The FET circuit can also be applied to the 2T1D cell memory circuit 500 of FIG. 5 and the 3T (or 3T1C) gain cell memory circuit 600 of FIG. 6, by replacing the 3T1D memory cell with a 2T1D memory cell or a 3T (or 3T1C) gain cell. The sense amplifier blocks (SA and RSA) of FIGS. 4-6 can be gated diode-based single-ended sense amplifiers (or alternatives). The skilled artisan will be familiar with such gated diode-based single-ended sense amplifiers, per se, and giving the teachings herein, will be readily able to adapt them for use with embodiments of the invention. See, for example, U.S.

Patent Application Publication Number 20050145895, entitled "Amplifiers Using Gated Diodes," filed Jan. 5, 2004. As discussed above, only a single cell and a single column's worth of refresh and bypass circuitry is shown in FIG. 7, but as indicated by the ellipsis, the circuit can include many cells arranged in rows and columns.

III.C. Scheduling Algorithm for Same Address Operations

For the above dynamic memory cells 400, 500, 600, 700 (refer to FIGS. 4-7) where hidden refresh for read operations is described, special handling techniques are advisable to resolve address conflicts (of read and write addresses) when, for example, the read address and refresh address refer to the same cell 400, 500, 600, 700. In one aspect of the invention, a scheduling algorithm schedules the read, write, and refresh operations to delay some operations and/or bypass some data from a write operation to a read operation (Write-Read bypass (WR_BYPASS)), from a read operation to read operation (Read-to-Read bypass, or the reusing of data from a previous read operation for a current read operation), or from a refresh operation to a read operation (refresh-read bypass (RFR_BYPASS)). The novel scheduling algorithm may also be performed at the array/bank level where address checking and data bypass circuits are implemented.

In a memory array, two wordlines are activated concurrently, one for read, one for write/refresh via BLr, BLw. For the "Refresh Operation with Hidden Refresh for Read via Write Port", write and refresh are interleaved at the write/refresh port (R port is not needed for refresh)

To illustrate the method, assuming clock cycle requirements for the read, write and refresh operations are in the ratio of R:W:RF=1:1:2, where the refresh takes typically 1 cycle to read from the array to the sense amplifier SA and another cycle to write-back the data to the storage element SE, a total of two cycles for refresh as shown below. For asynchronous operations, such operations can be subdivided into stages with appropriate proportions.

Figure 13A:
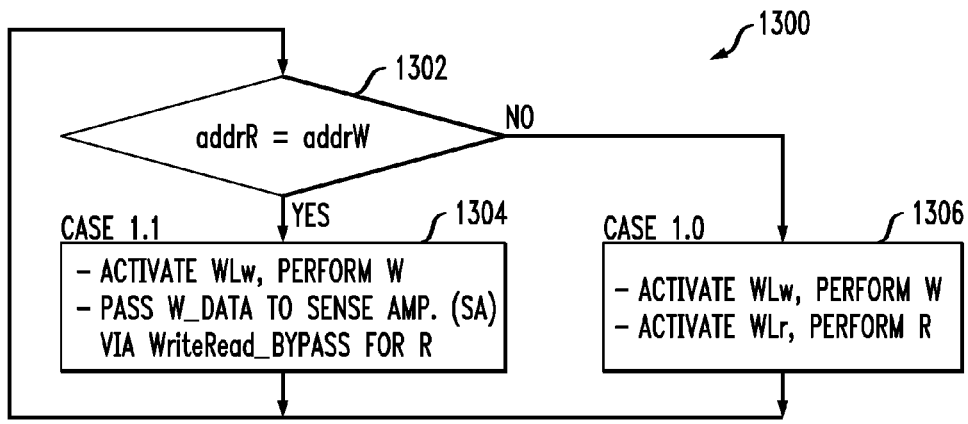
FIG. 13A shows an exemplary method of scheduling under different address conditions for read and write operations, in the form of a flow-chart.

The method of scheduling under the different address conditions for read and write operations is thus summarized in FIG. 13A in the form of flow-chart 1300.

Figure 13B:
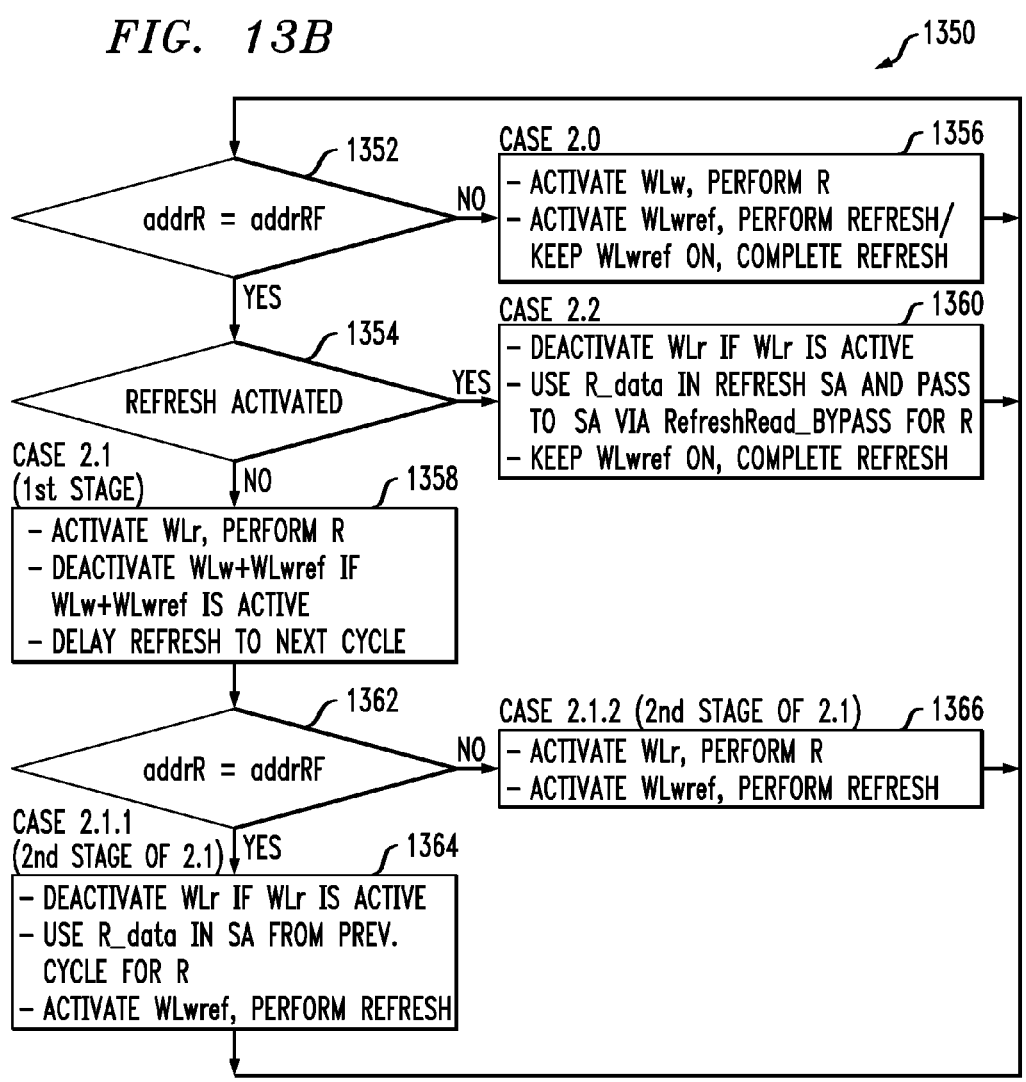
FIG. 13B shows an exemplary method of scheduling under different address conditions for read and refresh operations, in the form of flow-chart.

Case 2 (Read and Refresh Scheduling, Flow-Chart 1350 of FIG. 13B)

Case 2.0

If the read address is not the same as the refresh address ("no" branch of decision block 1352), then the following operations are performed at block 1356:

(1) Activate the wordline WLr to perform a read operation;
(2) Activate the wordline WLw+WLwref to perform a refresh operation, or keep the WLw+WLwref ON to complete a refresh operation.

Case 2.1

If the read address is the same as the refresh address ("yes" branch of decision block 1352) and the refresh operation has not been activated (in its first cycle/stage) ("no" branch of decision block 1354), then the following operations are performed during the current cycle at block 1358:

(1) Activate the wordline WLr to perform a read operation;
(2) Do not activate WLw+WLwref, if inactive; Deactivate wordline WLw+WLwref, if active; and
(3) Delay the refresh operation to the following clock cycle.

Case 2.1.1

During the second refresh cycle/stage of Case 2.1, if the read address is the same as the refresh address ("yes" branch of block 1362), then the following operations are performed, at block 1364:

(1) Do not activate Wlr (Deactivate wordline Wlr, if active) since no read operation is required;
(2) Perform the Read-Read bypass by reusing the data during the previous clock cycle stored in the sense amplifier 414, 514, 614, 714; and
(3) Activate the wordline WLwref to perform the refresh operation.

| R:W:RF = 1:1:2 | | | | | | | | | | | | | | | | | | | | | | | | |
|---|---|---|---|---|---|---|---|---|---|---|---|---|---|---|---|---|---|---|---|---|---|---|---|---|
| R | R | R | R | R | R | R | R | R | R | R | R | R | R | R | R | R | R | R | R | R | R | R | R | R |
| W | W | W | W | W | W | W | W | W | W | W | W | RF | | RF | | RF | | RF | | W | W | W | W | W | W | W |

Case 1 (Read and Write Scheduling, Flow-Chart 1300 of FIG. 13A)

Case 1.0

If the read address is not the same as the write address ("no" branch of decision block 1302), then the following operations are performed, at block 1306:

(1) Activate the wordline WLr to perform a read operation;
(2) Activate the wordline WLw to perform a write operation.

Case 1.1

If the read address is the same as the write address during the current cycle ("yes" branch of decision block 1302), then the following operations are performed, at block 1304:

the wordline WLr is not activated as there is no read of the stored data. The write-read bypass (WR_BYPASS) FET 408, 508, 608, 708, coupling the write data path and the read data path, is activated to pass the new data for the write operation directly to the sense amplifier 414, 514, 614, 714, without reading from DMC. The new data is then written to the memory array by activating the WLw+WLwref control signal.

Case 2.1.2

During the second refresh cycle/stage of Case 2.1, if the read address is not the same as the refresh address ("no" branch of decision block 1362), then the following operations are performed, at block 1366:

(1) Activate wordline WLr to perform a read operation; and
(2) Activate the wordline WLwref to perform the refresh operation.

Case 2.2

If the read address is the same as the refresh address ("yes" branch of decision block 1352) and the refresh operation has been activated ("yes" branch of decision block 1354), then the following operations are performed during the current cycle, in block 1360:

(1) Do not activate wordline Wlr; Deactivate wordline Wlr, if active, since no read operation is required;
(2) Activate the refresh-read bypass FET 418, 518, 618, 718, coupling the refresh data path and the read data path, to pass the data in the refresh sense amplifier 416, 516, 616, 716 (obtained during the first clock cycle of the refresh operation) directly to sense amplifier 414, 514, 614, 714, without reading from DMC; and (3) Maintain the activation of the wordline WLwref to complete the refresh operation.

The method of scheduling under the different address conditions for read and refresh operations is thus summarized in FIG. 13B in the form of flow-chart 1350.

The memory controller will schedule the write and refresh operations alternatively since the refresh-write port for the same bank is shared. Also, since the read address and refresh address conflict (see, Cases 2.1-2.2 above) may result in a delay of the refresh operation by 1 clock cycle, for simplicity, the external memory controller should allocate 3 clock cycles for the refresh operation, i.e., R:W:RF=1:1:3 for the external memory controller, as shown below.

| R:W:RF = 1:1:3 (1 clock delay to handle RF address conflict) |||||||||||||||||||||||||
|---|---|---|---|---|---|---|---|---|---|---|---|---|---|---|---|---|---|---|---|---|---|---|---|---|
| R | R | R | R | R | R | R | R | R | R | R | R | R | R | R | R | R | R | R | R | R | R | R | R | R |
| W | W | W | W | W | W | W | W | W | W | W | W |   | RF |   | RF |   | RF |   | RF |   | W | W | W | W |

For the non-hidden refresh, operation for read operations as illustrated in FIGS. 3A, 3B, and 3C, when the read address and the write address are the same, operations similar to that described in Case 1 are performed The wordline WLr is not activated as there is no read of the stored data. The write-read bypass (WR_BYPASS) FET 310, 330, 350, coupling the write data path and the read data path, is activated to pass the new data for the write operation directly to the sense amplifier 314, 334, 354, without reading from the DMC. The new data is then written to the memory array by activating the WLwref control signal.

Figure 8:
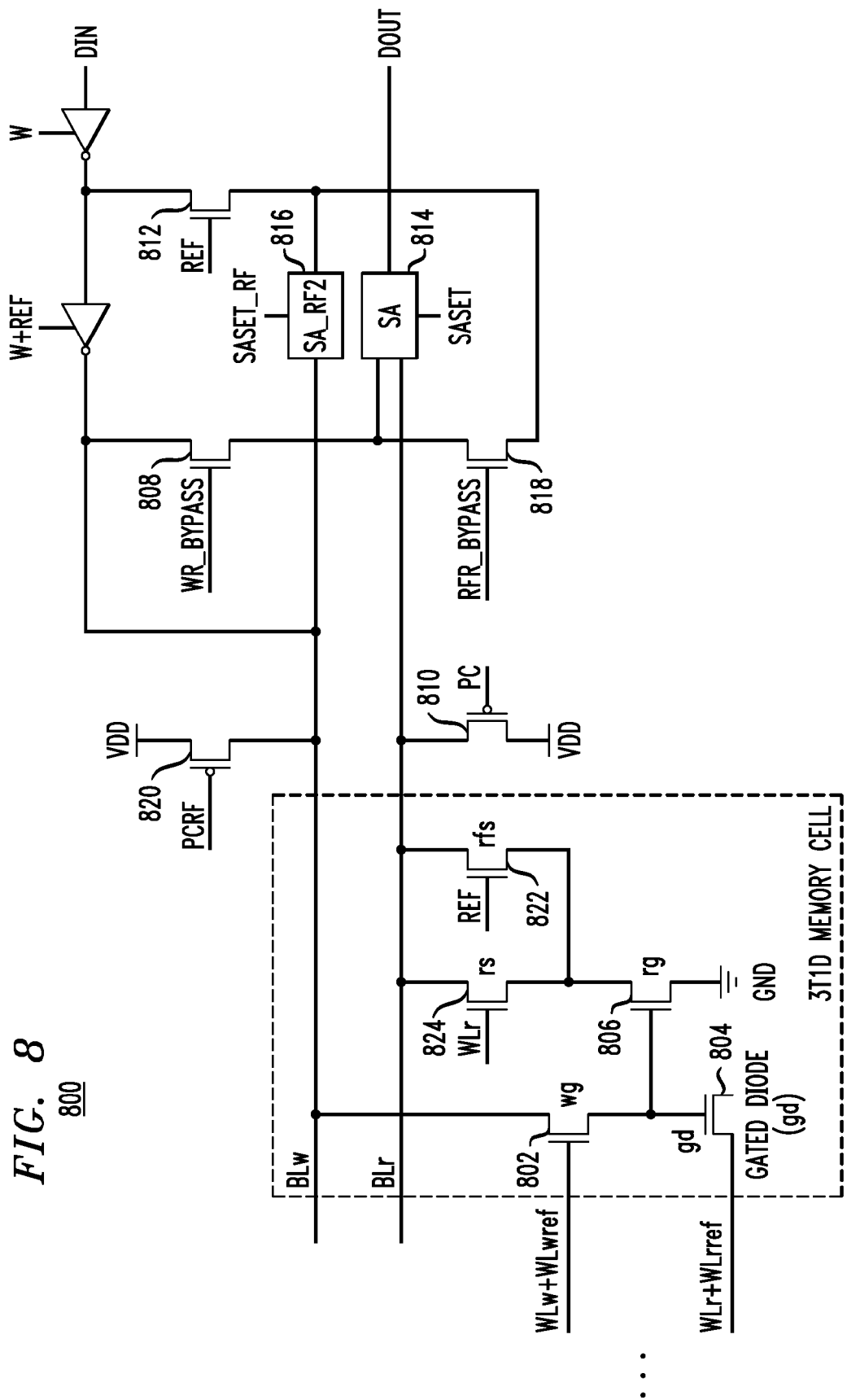
FIG. 8 shows block diagrams of the exemplary embodiment of the 3T1D-cell memory circuit of FIG. 4 incorporating a novel refresh select device.
Figure 9:
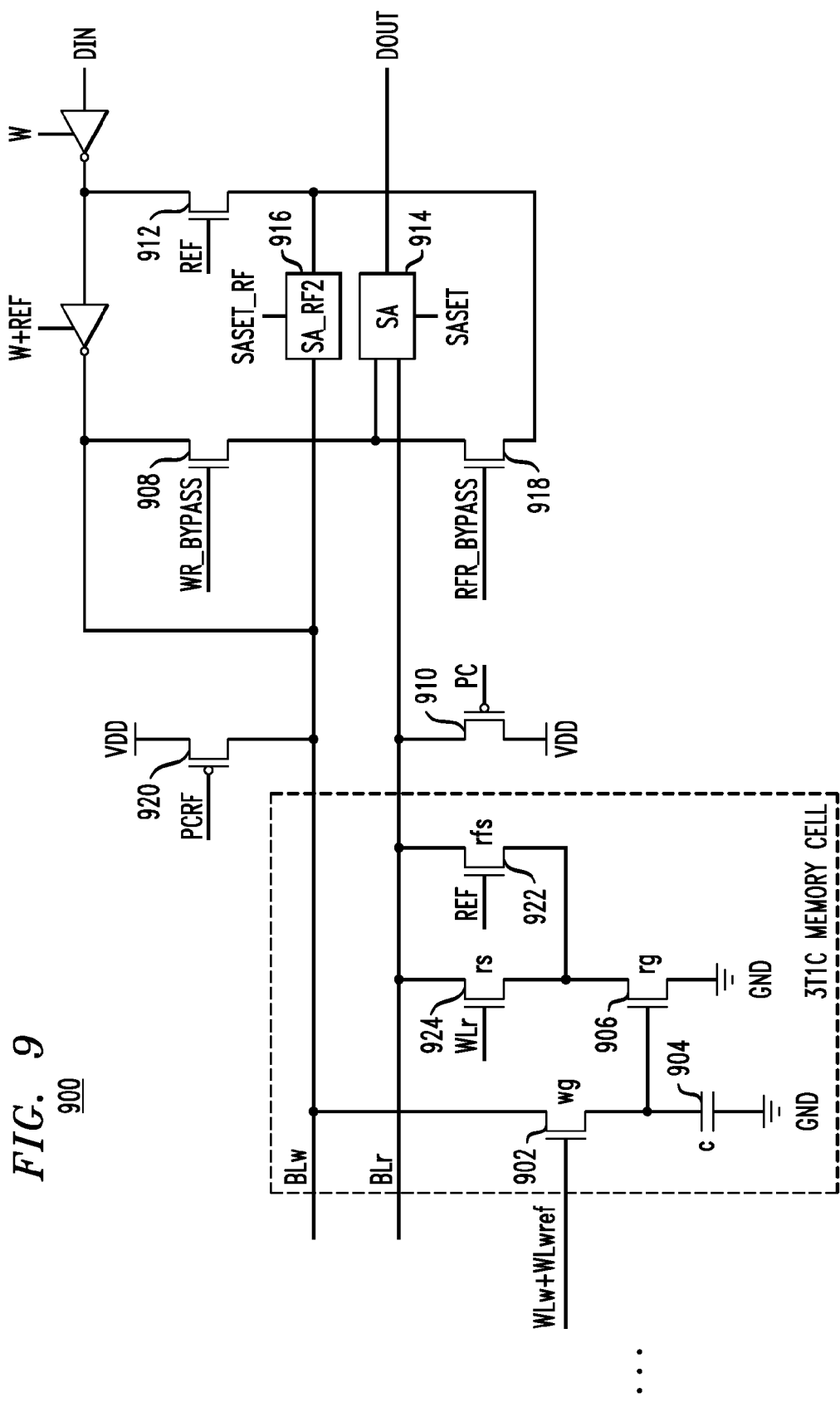
FIG. 9 shows block diagrams of the exemplary embodiment of the 3T, 3T1C-cell memory circuit incorporating a novel refresh select device.

IV. Non-Destructive Refresh Operation via Write-Port with Hidden Refresh for Read Operation During the refresh-read operation (for the above described hidden refresh operation for a read operation described in Section III), the stored cell charge and voltage is destroyed since the storage element SE is operatively coupled to the write bit line and charges are shared between the two (commonly known as a destructive read operation). In one aspect of the present invention, the hidden refresh operation for read can be performed without altering the stored charges. The disclosed method can be applied to the exemplary 3T1D gated diode memory cell 400 or the exemplary 3T (or 3T1C) gain cell 600. As shown in FIGS. 8 and 9, an additional "refresh select bypass" device, for example FET 822, 922 is added, with its gate connected to the refresh control signal (REF), its source connected to the source of the read select device 824, 924, and its drain operatively coupled to the write bit line (BLw).

As the read select device 824, 924 enables and connects the read device 806, 906 to the read bit line (BLr) to perform the non-destructive (i.e. reading does not destroy the data) read operation (for the 3T1D and 3T (or 3T1C) cell memory circuits 400, 600), the refresh select bypass device 822, 922 functions similarly during a refresh operation, connecting the read device 806, 906 to the write bit line (BLw). To perform a refresh operation, the write bit line is first precharged to HIGH. If the storage element 804, 904 stored a 0-data, the read device 806, 906 will be OFF while the refresh select bypass device 822, 922 and the write bit line stays HIGH. If the storage element 804, 904 stored a 1-data, the read device 806, 906 and the refresh select bypass device 822, 922 will be ON, so the write bit line is discharged to LOW. The difference in voltage level is detected by the refresh sense amplifier 816, 916 as 0- or 1-data. The refresh sense amplifier 816, 916 operates similar to the read sense amplifier 814, 914. The voltage and charge stored in the storage element 804, 904 are not altered during the refresh operation. As the charge in the storage element 804, 904 is not altered during refresh operations, the time needed for the refresh operation can be shortened. The read, write, and refresh operation scheduling described previously applies to this scheme also. Once again, as discussed above, only a single cell and a single column's worth of refresh and bypass circuitry is shown in FIGS. 8 and 9, but as indicated by the ellipsis in each figure, the circuits 800, 900 can include many cells arranged in rows and columns.

At this point, it should be noted that a sense amplifier can be designed without an external refresh bypass device (or by including the refresh bypass device as part of the sense amplifier, or by some other techniques) and that the data in the sense amplifier is written back to the capacitive storage device via the write port. The refresh bypass device and inverters/buffers in the write-line are exemplary, typical circuit elements, and the skilled artisan, given the teachings herein, will appreciate that the inventive concept of writing data to the capacitive storage device via the write port and write-line can be implemented using a variety of alternative techniques.

Figure 10:
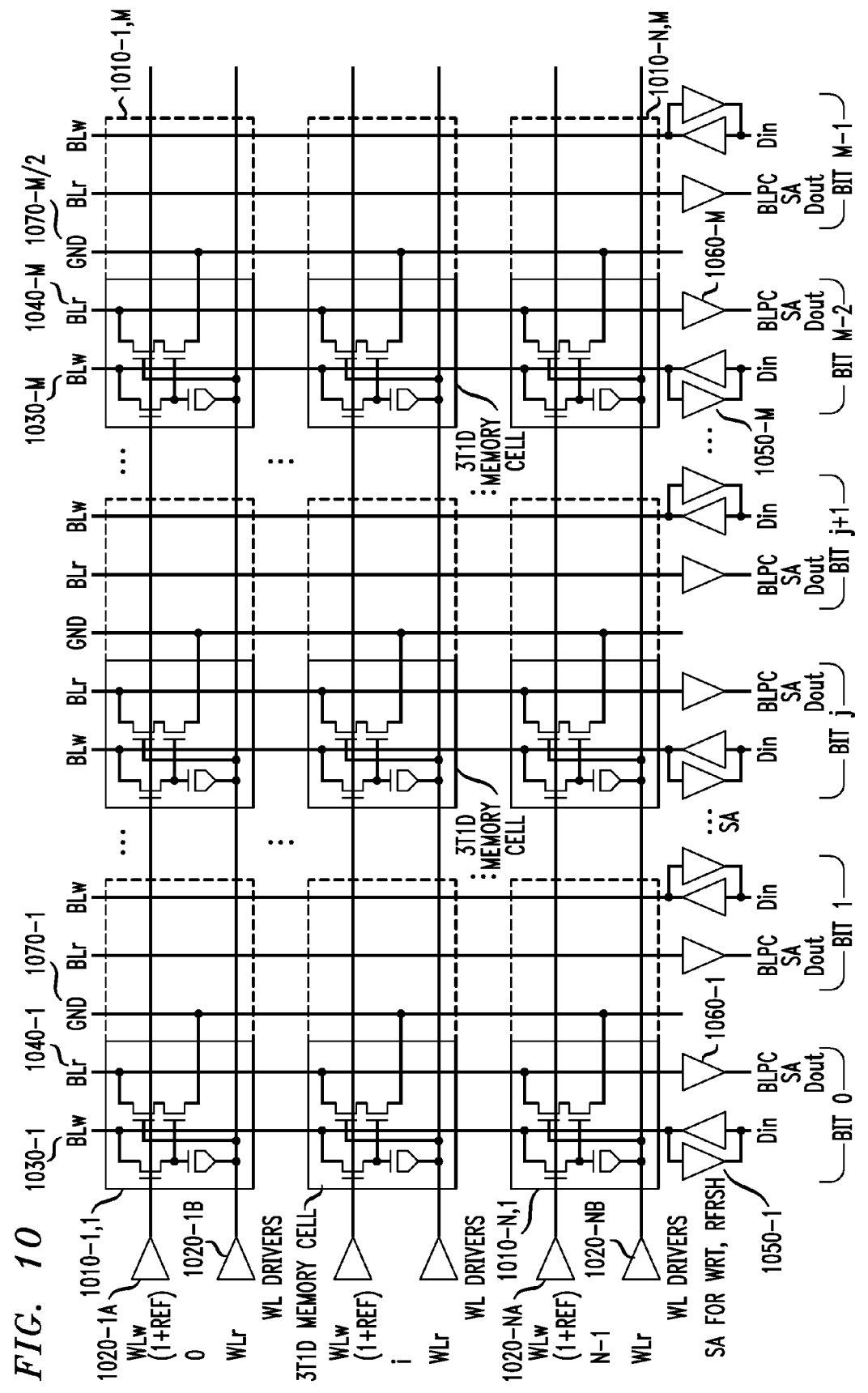
Figure 11:
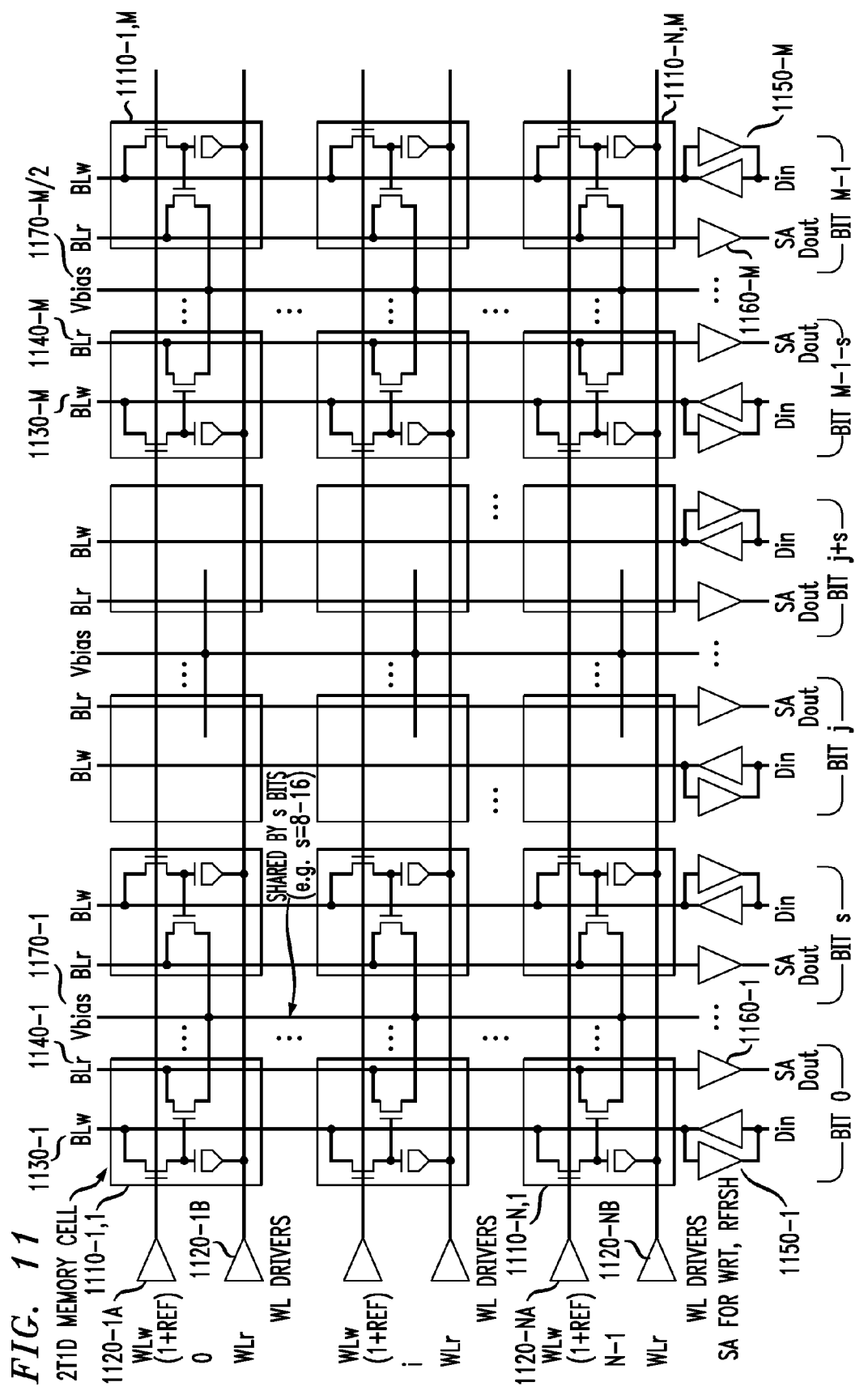

FIG. 10 shows an exemplary array structure of the exemplary 3T1D gated diode memory with refresh using the write-port and FIG. 11 shows an exemplary array structure of the exemplary 2T1D gated diode memory with refresh using the write-port. FIGS. 10 and 11 show a plurality of gated diode memory cells 1010-1,1 through 1010-N,M and 1110-1,1 through 1110-N,M formed by placing the cells in a two dimensional array, with write word lines (coupled to drivers 1020-1A through 1020-NA and drivers 1120-1A through 1120-NA) and read word lines (coupled to drivers 1020-1B through 1020-NB and drivers 1120-1B through 1120-NB) running in parallel in one direction, for example, horizontally, and write bit lines 1030-1 through 1030-M and 1130-1 through 1130-M, read bit lines 1040-1 through 1040-M and 1140-1 through 1140-M, and ground (GND) lines 1070-1 through 1070-M/2 (for FIG. 10) and Vbias lines 1170-1 through 1170-M/2 (for FIG. 11) running orthogonally, for example vertically. The intersection of a bit line and a word line defines the location of a memory cell, or bit of data storage. For a refresh operation performed via the write port, refresh sense amplifiers are coupled to the end of the write bit lines to detect the cell voltage through the write bit lines, store the detected data, and write back the detected data to the cells. The write-read bypass (WR_BYPSS) and the refresh-read bypass (RFR_BYPASS) transistors and paths coupling between the write paths, the read paths, and the refresh paths as detailed in FIGS. 4-9 are not shown here, for purposes of illustrative convenience. Additionally, write bit line drivers (Din) and refresh sense amplifiers (SA_RF) 1050-1 through 1050-M and 1150-1 through 1150-M and read bit line sense amplifiers 1060-1 and 1060-M and 1160-1 and 1160-M are used. It should be noted that "BLPC" in the figures means bit line precharge, as the read bit lines 1040-1 through 1040-M and 1140-1 through 1140-M are typically precharged during a read operation, and "SA" stands for a "sense amplifier" used for detecting the signal on a read bit line (BLr) during a read operation.

V. Multi-Port Dynamic Memory Refresh Operation

Embodiments with dual lead-write port have been presented. The concept, however, can be readily applied to multi-port dynamic memory with at least one read-port and one write-port, as any one of the read ports and any one of the write ports can be used for the various refresh schemes presented earlier, including the scheduling algorithm for the read, write, and refresh operations.

VI. Multi-Port Hierarchical Bit Lines and Datalines

Figure 12A:
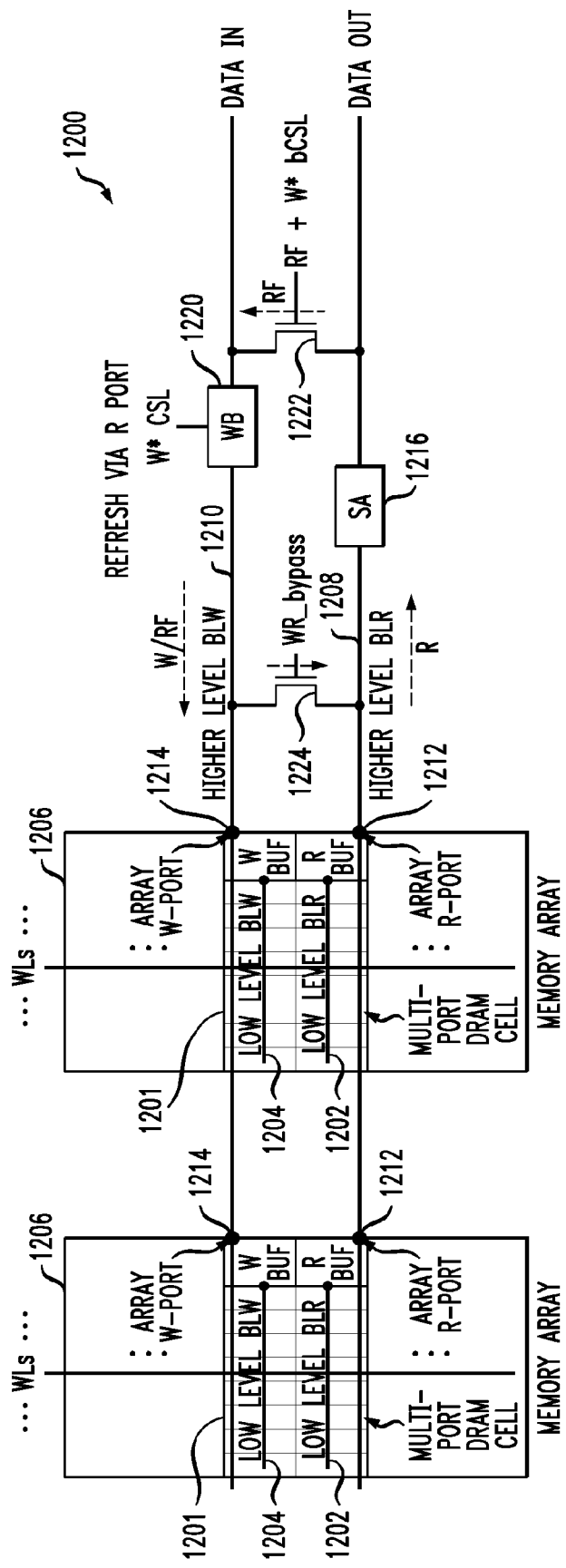
FIGS. 12A and 12B are similar to FIGS. 2A and 2B respectively, but for exemplary alternative hierarchical approaches.
Figure 12B:
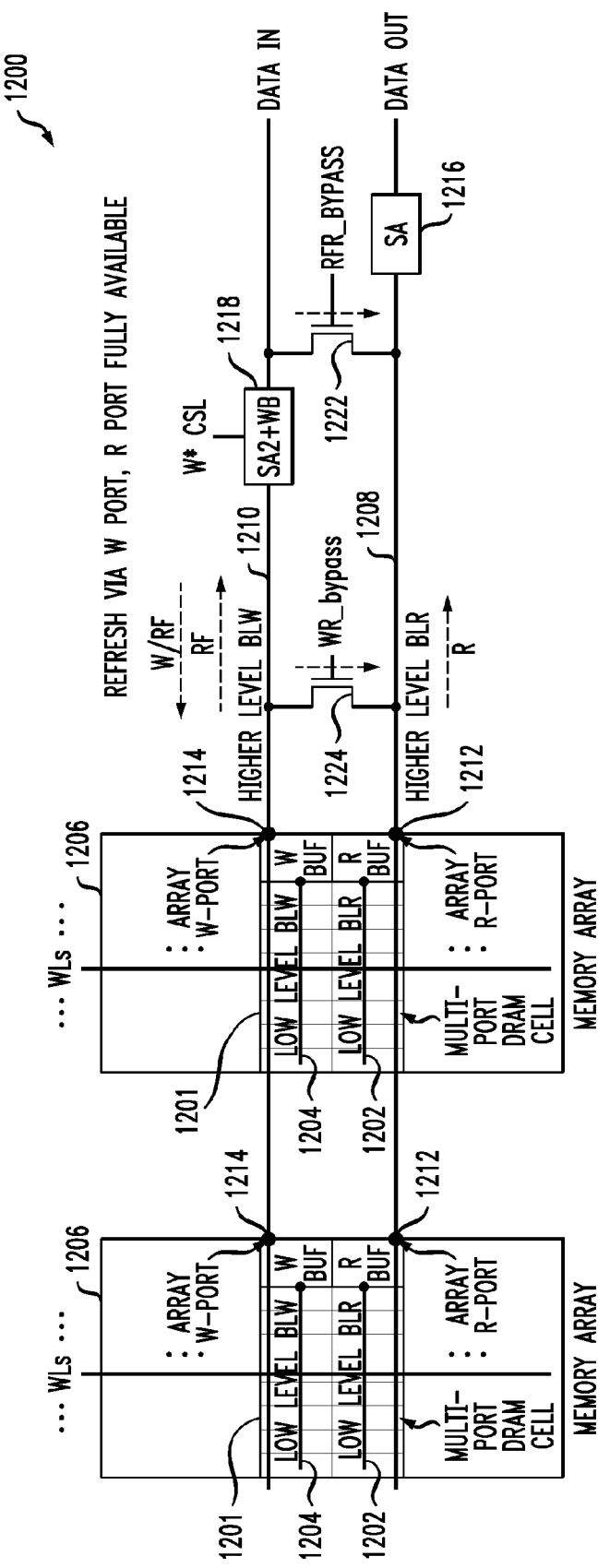

Referring now to FIGS. 12A and 12B, in DRAM structures 1200 where there are multiple levels of read/write bit lines, local bit lines 1202 (read) and 1204 (write) are first operatively coupled to the storage cells 1201 of an array 1206 or sub-array, then the read/write data of the local bit lines 1202, 1204 are further routed to a second level of bit lines 1208 (read) and 1210 (write) via an intermediate logic circuit (for example, AND gates to combine two adjacent arrays) or buffers at the array read-ports (array R-ports 1212) and the array write-ports (array W-ports 1214), or even to higher levels of bit lines likewise as shown in FIGS. 12A and 12B. The hierarchical bit line structure allows sense amplifiers 1216, 1218 (SA, SA2), write buffers 1220 and inside 1218 (WB) and the related circuits to serve multiple arrays of cells for read, write and refresh operations via the higher level bit lines 1208, 1210.

A higher level read bit line 1208 (higher level BLR in FIGS. 12A and 12B) and a higher level write bit line 1210 (higher level BLW in FIGS. 12A and 12B) are operatively coupled to an array R-port and an array-W port 1212, 1214 respectively as if a local read bit line and a local write bit line 1202, 1204 are operatively coupled respectively to a cell read-port and a cell write-port as described previously, but at a higher level of the bit line structure. Reading data from the cells, writing data to the cells, refresh operation via the R/W-ports and the refresh operation via the exclusive write-ports can be carried out over the higher level read and write bit lines 1208, 1210 as shown in FIGS. 12A and 12B.

These second or higher levels of bit lines 1208, 1210 are also known as read/write global bit lines or read/write datalines or read/write lines along which read/write data are routed to the corresponding read and write ports between the storage devices and the inputs/outputs of the entire memory system. It should be pointed out that one or more exemplary inventive techniques and method of refresh via: (1) the read and write ports, and (2) the exclusive write port, are applicable to the second level or higher levels of read/write bit lines 1208, 1210. Here the term read/write bit line is used interchangeably with read/write global bit lines, or read/write datalines, or read/write lines in the hierarchical bit line/dataline structure.

In an embodiment of hierarchical bit lines as shown in FIG. 12A, the first sense amplifier 1216 is operatively coupled to the read port 1212 along the second level (or a higher level) read bit line 1208. The (external) refresh bypass device 1222 is operatively coupled between the second level (or a higher level) read and write bit line 1208, 1210 performing the refresh function using the read and write ports as described previously for the non-hierarchical bit line. In the case that the refresh bypass device is implemented within the first sense amplifier 1216, the sense amplifier output can be operatively coupled to the second level (or a higher level) write bit line 1210 to perform the refresh function. The write-read bypass device 1224 is operatively coupled between the second level (or a higher level) write bit lines 1210 and read bit lines 1208 passing the data from the data input signal to a data output signal when a read address and write address identify the dynamic access memory cell.

In another embodiment of hierarchical bit lines as shown in FIG. 12B, the first sense amplifier 1216 is operatively coupled to the read port 1212 along the second level (or a higher level) read bit line 1208. The refresh sense amplifier 1218 is operatively coupled to the write port 1214 along the second level (or a higher level) write bit line 1210. The (external) refresh bypass device (not shown) is operatively coupled between (the output of) the refresh sense amplifier 1218 and the second level (or a higher level) write bit line 1210, performing the refresh function using the exclusive write port as described previously, for example, in section III above, for the non-hierarchical bit line. In the case that the refresh bypass device is implemented within the said refresh sense amplifier 1218, the sense amplifier output can be operatively coupled to the second level (or a higher level) write bit line 1210 to perform the refresh function. The write-read bypass device 1224 is operatively coupled between the second level (or a higher level) write bit lines 1210 and read bit lines 1208, passing the data from the data input signal to a data output signal when a read address and write address identify the dynamic access memory cell. The refresh-read bypass device 1222 is operatively coupled to the refresh sense amplifier 1218 and at least one of the second level (or a higher level) read bit line 1208, operatively coupled to the first sense amplifier 1216. The refresh sense amplifier 1218 is configured to selectively pass the refresh sense amplifier output signal to a signal point associated with one of the second level (or higher level) read bit line 1208 and the first sense amplifier 1216 for output to a data output.

With regard to FIGS. 12A and 12B, it should be noted that throughout this application, including the claims, cells and elements thereof are mentioned as being interconnected with, operatively coupled to, or operatively associated with at least one read bit line or at least one write bit line. Such language, and similar language, is not intended to be limiting and is intended to encompass, for example, the case of single read and write bit lines as shown in FIGS. 2A and 2B, multiple lines as in FIG. 2C, and composites of lower and higher level lines as in FIGS. 12A and 12B.

It is to be understood that the embodiments and variations shown and described herein are merely illustrative of the principles of this invention and that various modifications may be implemented by those skilled in the art without departing from the scope and spirit of the invention.

What is claimed is:

1. A dynamic random access memory circuit comprising:
at least one write bit line;
at least one read bit line;
a capacitive storage device;
a write access device, said write access device being operatively coupled to said capacitive storage device and said at least one write bit line;
a sense amplifier, said sense amplifier being operatively coupled to said at least one read bit line and configured to generate an output signal;
a refresh bypass device, said refresh bypass device being operatively associated with said sense amplifier and said at least one write bit line so as to selectively pass said output signal to said at least one write bit line; and
a write-read bypass device, said write-read bypass device being operatively coupled to said at least one write bit line and said at least one read bit line and being configured to selectively pass a write signal from a write bit line signal point along said at least one write bit line to a read bit line signal point along said at least one read bit line for output to a data output.

2. The dynamic random access memory circuit of claim 1, wherein said sense amplifier has an input, said write-read bypass device is operatively coupled to said sense amplifier input, and said write-read bypass device is configured to selectively pass said write signal from said write bit line signal point to said input of said sense amplifier.

3. A dynamic random access memory circuit comprising:
at least one write bit line;
at least one read bit line;
a capacitive storage device;
a write access device, said write access device being operatively coupled to said capacitive storage device and said at least one write bit line;
a first sense amplifier, said first sense amplifier being operatively coupled to said at least one read bit line and configured to generate an output signal;
a refresh sense amplifier, said refresh sense amplifier being operatively coupled to said at least one write bit line and configured to generate a refresh sense amplifier output signal; and
a refresh bypass device, said refresh bypass device being operatively associated with said refresh sense amplifier and said at least one write bit line so as to selectively pass said refresh sense amplifier output signal to said at least one write bit line.

4. The dynamic random access memory circuit of claim 3, wherein said refresh bypass device is separate from and operatively coupled to said refresh sense amplifier.

5. The dynamic random access memory circuit of claim 3, wherein said refresh bypass device is implemented inside said refresh sense amplifier.

6. The dynamic random access memory circuit of claim 3, further comprising a write-read bypass device, said write-read bypass device being coupled to said at least one write bit line and said at least one read bit line and being configured to selectively pass a write signal from a write bit line signal point along said at least one write bit line to a read bit line signal point along said at least one read bit line for output to a data output.

7. The dynamic random access memory circuit of claim 6, wherein said first sense amplifier has an input, said write-read bypass device is operatively coupled to said first sense amplifier input, and said write-read bypass device is configured to selectively pass said write signal from said write bit line signal point to said input of said sense amplifier.

8. The dynamic random access memory circuit of claim 7, further comprising a refresh read bypass device, said refresh read bypass device being operatively coupled to said refresh sense amplifier and at least one of said read bit line and said first sense amplifier, said refresh sense amplifier being configured to selectively pass said refresh sense amplifier output signal to a signal point associated with one of said read bit line and said first sense amplifier for output to a data output.

9. The dynamic random access memory circuit of claim 8, wherein said first sense amplifier has an input, said refresh read bypass device is operatively coupled to said first sense amplifier input, and said refresh read bypass device is configured to selectively pass said refresh sense amplifier output signal to said input of said first sense amplifier.

10. The dynamic random access memory circuit of claim 8, wherein said first sense amplifier has a tristate output, said refresh read bypass device is operatively coupled to said first sense amplifier tristate output, and said refresh read bypass device is configured to selectively pass said refresh sense amplifier output signal to said tristate output of said first sense amplifier.

* * * * *